(12) United States Patent
Liu et al.

(10) Patent No.: US 11,769,745 B2
(45) Date of Patent: Sep. 26, 2023

(54) CHIP STRUCTURE, PACKAGING STRUCTURE AND MANUFACTURING METHOD FOR CHIP STRUCTURE

(71) Applicant: BOE TECHNOLOGY GROUP CO., LTD., Beijing (CN)

(72) Inventors: Zongmin Liu, Beijing (CN); Liye Duan, Beijing (CN); Jijing Huang, Beijing (CN); Mengjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 43 days.

(21) Appl. No.: 17/489,759

(22) Filed: Sep. 29, 2021

(65) Prior Publication Data
US 2022/0139859 A1 May 5, 2022

(30) Foreign Application Priority Data
Oct. 30, 2020 (CN) .......................... 202011197007.9

(51) Int. Cl.
*H01L 23/00* (2006.01)
*H01L 23/498* (2006.01)
*H01L 23/66* (2006.01)

(52) U.S. Cl.
CPC .......... *H01L 24/13* (2013.01); *H01L 23/4985* (2013.01); *H01L 23/66* (2013.01);
(Continued)

(58) Field of Classification Search
CPC ..... H01L 24/13; H01L 23/4985; H01L 23/66; H01L 24/03; H01L 24/05; H01L 24/11; H01L 24/16; H01L 2224/0345; H01L 2224/0401; H01L 2224/05082; H01L 2224/05144; H01L 2224/05166; H01L 2224/05184; H01L 2224/11462; H01L 2224/13013; H01L 2224/13021;
(Continued)

(56) References Cited

U.S. PATENT DOCUMENTS

7,791,203 B2 * 9/2010 Boon ...................... H01L 24/97
257/773
2020/0135654 A1 * 4/2020 Lee ..................... H01L 23/5383
(Continued)

*Primary Examiner* — Douglas W Owens
(74) *Attorney, Agent, or Firm* — Nath, Goldberg & Meyer; Joshua B. Goldberg (57) ABSTRACT

The present disclosure provides a chip structure, a packaging structure and a manufacturing method for the chip structure. The chip structure includes at least one chip body, each of which includes at least one radio frequency front-end device; the chip structure further includes a redistribution layer stacked on the chip body and at least one pin on the redistribution layer; each radio frequency front-end device corresponds to one pin, which is electrically connected to the radio frequency front-end device through an electrical connector extending through the redistribution layer; an extending direction of the radio frequency front-end device is consistent with an extending direction of the pin corresponding to the radio frequency front-end device; a surface of the pin distal to the redistribution layer is a first plane. In the present disclosure, with the first plane, the chip may be directly and electrically connected to a flexible circuit board.

17 Claims, 5 Drawing Sheets

(52) U.S. Cl.
CPC .............. *H01L 24/03* (2013.01); *H01L 24/05* (2013.01); *H01L 24/11* (2013.01); *H01L 24/16* (2013.01); *H01L 2224/0345* (2013.01); *H01L 2224/0401* (2013.01); *H01L 2224/05082* (2013.01); *H01L 2224/05144* (2013.01); *H01L 2224/05166* (2013.01); *H01L 2224/05184* (2013.01); *H01L 2224/11462* (2013.01); *H01L 2224/13013* (2013.01); *H01L 2224/13021* (2013.01); *H01L 2224/13144* (2013.01); *H01L 2224/16227* (2013.01)

(58) Field of Classification Search
CPC . H01L 2224/13144; H01L 2224/16227; H01L 2224/05027; H01L 2224/05572; H01L 2224/05644; H01L 2224/1147; H01L 2224/13007; H01L 2224/13022; H01L 2224/81201; H01L 23/4824; H01L 23/4827; H01L 24/81; H01L 1/184; H01L 2224/0231; H01L 2224/02331; H01L 2224/02375; H01L 2224/02381; H01L 2224/81203
See application file for complete search history.

(56) References Cited

U.S. PATENT DOCUMENTS

2021/0359387 A1* 11/2021 Hartner ................... H01P 5/107
2022/0336335 A1* 10/2022 Wu ....................... H01L 23/562

* cited by examiner

CHIP STRUCTURE, PACKAGING STRUCTURE AND MANUFACTURING METHOD FOR CHIP STRUCTURE

CROSS REFERENCE TO RELATED APPLICATIONS

The present application claims the priority of the Chinese Patent Application No. 202011197007.9 filed on Oct. 30, 2020, the content of which is incorporated herein by reference in its entirety.

TECHNICAL FIELD

The present disclosure relates to the field of integrated circuit technology, and in particular to a chip structure, a packaging structure, and a method for manufacturing the chip structure.

BACKGROUND

Conventional RFICs (radio frequency integrated circuits) mainly use BGA packages (Ball Grid Array packages) or QFN packages (Quad Flat No-lead packages) to obtain low impedance and self-inductance.

SUMMARY

The present disclosure provides a chip structure, a packaging structure, and a method for manufacturing the chip structure.

In a first aspect, the present disclosure provides a chip structure, including at least one chip body, each of which includes at least one radio frequency front-end device, wherein the chip structure further includes a redistribution layer stacked on the at least one chip body and at least one pin on the redistribution layer; and each of the at least one radio frequency front-end device at least corresponds to one pin of the at least one pin; the pin is electrically connected to the corresponding radio frequency front-end device through a electrical connector extending through the redistribution layer; an extending direction of the radio frequency front-end device on a surface of the redistribution layer is consistent with an extending direction of the pin corresponding to the radio frequency front-end device on the surface of the redistribution layer, and a surface of the pin distal to the redistribution layer is a first plane.

In some embodiments, the first plane has a shape of a rectangle, and a surface of the radio frequency front-end device proximal to the pin has a shape of a second rectangle as well.

In some embodiments, a size of the first rectangle and/or the second rectangle is within 2 mm×50 mm.

In some embodiments, the chip structure further includes at least one via corresponding to the at least one pin in the redistribution layer, wherein the electrical connector is arranged in the corresponding via, includes a first conductive connection layer, a second conductive connection layer and a conductive connection body sequentially arranged along a direction distal to the radio frequency front-end device; the conductive connection body is configured to be connected to the pin, the first conductive connection layer covers a side wall and a bottom wall of the via and is electrically connected to the radio frequency front-end device; the second conductive connection layer covers the first conductive connection layer and has a recess in the redistribution layer as a secondary via; and the conductive connection body is in the secondary via, and is electrically connected to the pin.

In some embodiments, the redistribution layer is a passivation layer.

In some embodiments, a portion of the at least one chip body includes a radio frequency inlet region, a radio frequency outlet region and a power supply region; and the radio frequency inlet region, the radio frequency outlet region and the power supply region have one or more radio frequency front-end devices, respectively.

In some embodiments, a surface of the chip body in contact with the redistribution layer is a rectangle; the radio frequency inlet region includes a plurality of sub-inlet regions symmetrically arranged on two opposite sides of the rectangle, each of the plurality of sub-inlet regions has one radio frequency front-end device; the radio frequency outlet region includes a plurality of sub-outlet regions symmetrically arranged on two opposite sides of the rectangle, each of which has one radio frequency front-end device; the power region includes a plurality of sub-power regions symmetrically arranged on two opposite sides of the rectangle, each of which has one radio frequency front-end device.

In some embodiments, the pin, the conductive connection body and the second conductive connection layer are made of a same material.

In some embodiments, the pin, the conductive connection body and the second conductive connection layer are all made of gold; and the first conductive connection layer includes a titanium metal layer and/or a tungsten metal layer.

In a second aspect, the present disclosure provides a packaging structure, which includes a flexible circuit board and the chip structure provided in the first aspect, where the flexible circuit board includes at least one electrical connection pad electrically connected to the at least one pin.

In a third aspect, the present disclosure provides a manufacturing method for a chip structure, including steps of:

providing at least one chip body, wherein the at least one chip body includes at least one radio frequency front-end device;

forming a redistribution layer on the at least one chip body;

forming at least one pin on the redistribution layer, so that each of the at least one pin is electrically connected to a corresponding radio frequency front-end device through a corresponding electrical connector extending through the redistribution layer, and each radio frequency front-end device at least corresponds to one pin of the at least one pin, wherein an extending direction of the pin on a surface of the redistribution layer is consistent with an extending direction of the radio frequency front-end device corresponding to the pin on the surface of the redistribution layer; and a surface of the pin distal to the redistribution layer is a first plane.

In some embodiments, the step of forming at least one pin on the redistribution layer so that each of the at least one pin is electrically connected to a corresponding radio frequency front-end device through a corresponding electrical connector extending through the redistribution layer includes steps of:

forming a via extending through the redistribution layer at a position where the redistribution layer covers the radio frequency front-end device;

forming a first conductive connection layer of the electrical connector, wherein the first conductive connection layer covers a side wall and a bottom wall of the via and is electrically connected to the radio frequency front-end device;

forming a second conductive connection layer of the electrical connector on the first conductive connection layer, thereby forming a recess as a secondary via in the redistribution layer;

coating photoresist on the second conductive connection layer, and exposing and developing the photoresist, to form a molding cavity of the pin and expose the secondary via;

forming a conductive connection body of the electrical connector within the secondary via, and forming the pin within the molding cavity through an electroplating process; and removing a portion of the first conductive connection layer and the second conductive connection layer which are not covered by the pin.

In some embodiments, the step of forming the first conductive connection layer of the electrical connector includes forming the first conductive connection layer of the electrical connector through a magnetron sputtering process; and the step of forming the second conductive connection layer of the electrical connector on the first conductive connection layer includes forming the second conductive connection layer of the electrical connector on the first conductive connection layer through a magnetron sputtering process.

In some embodiments, the step of forming the conductive connection body of the electrical connector within the secondary via and forming the pin within the molding cavity includes forming the conductive connection body of the electrical connector within the secondary via and forming the pin within the molding cavity through an electroplating process.

DETAIL DESCRIPTION OF EMBODIMENTS

The present disclosure is described in detail below and examples of embodiments of the present disclosure are illustrated in the accompanying drawings, wherein the same or similar reference numerals refer to the same or similar elements or elements with the same or similar functionality throughout the specification. In addition, if a detailed description of the well-known art is unnecessary for features stated in the present disclosure, it is omitted. The embodiments described below with reference to the accompanying drawings are exemplary only for explaining the present disclosure and are not construed as limiting the present disclosure.

It will be understood by a person skilled in the art that, unless otherwise defined, all terms (including technical and scientific terms) used herein have the same meaning as commonly understood by a person skilled in the art to which this application belongs. It will be further understood that terms, such as those defined in commonly used dictionaries, should be interpreted as having a meaning that is consistent with their meaning in the context of the prior art and will not be interpreted in an idealized or overly formal sense, unless expressly so defined herein.

It will be understood by a person skilled in the art that, unless otherwise defined, the singular form "a", "an" or "the" as used herein is intended to include the plural forms as well. It will be understood that when an element is referred to as being "connected" or "coupled" to another element, it may be directly connected or coupled to the other element or intervening elements may also be present therebetween. Further, "connected" or "coupled" as used herein may include wirelessly connected or wirelessly coupled. As used herein, the wording "and/or" includes all or any element and all combinations of one or more of the associated listed items.

The technical solutions of the present disclosure and how to solve the above technical problems by the technical solutions of the present disclosure will be described in detail below in conjunction with the accompanying drawings with the specific embodiments.

In these embodiments, after studying a conventional RFIC (radio frequency integrated circuit) packaging technology, it is found that the conventional RFIC packaging technology, such as BGA (Ball Grid Array) or QFN (Quad Flat No-leads Package), may only electrically connect a chip to a rigid PCB or a reinforced FPC by soldering through an SMT process. Due to a melting temperature and alignment of solder balls, a shape and a size of the package, and the like, the conventionally packaged RFIC cannot be electrically connected to a flexible circuit board in a bonding (also referred to as a connection process) manner. For example, taking a plastic package BGA as an example, the packaging procedure roughly includes the following processes: wafer thinning→wafer cutting→chip adhering→plasma cleaning→wire bonding→plasma cleaning→molding packaging→assembling solder ball→reflow soldering→surface marking→separating→finally inspecting. Because chip functions are complicated and pins are numerous, most packages are designed to be square, which leads to some problems, such as an increase in PCB design complexity, uneven simultaneous heating by a bonding pressure head. Further, a bonding temperature of solder balls generally reaches about 300° C., under the effect of high temperature and solder balls melting, a substrate of the flexible circuit board may be deformed. Therefore, the current RFICs based on BGA packages are electrically connected to a rigid PCB or a reinforced flexible FPC by SMT soldering.

Figure 1:
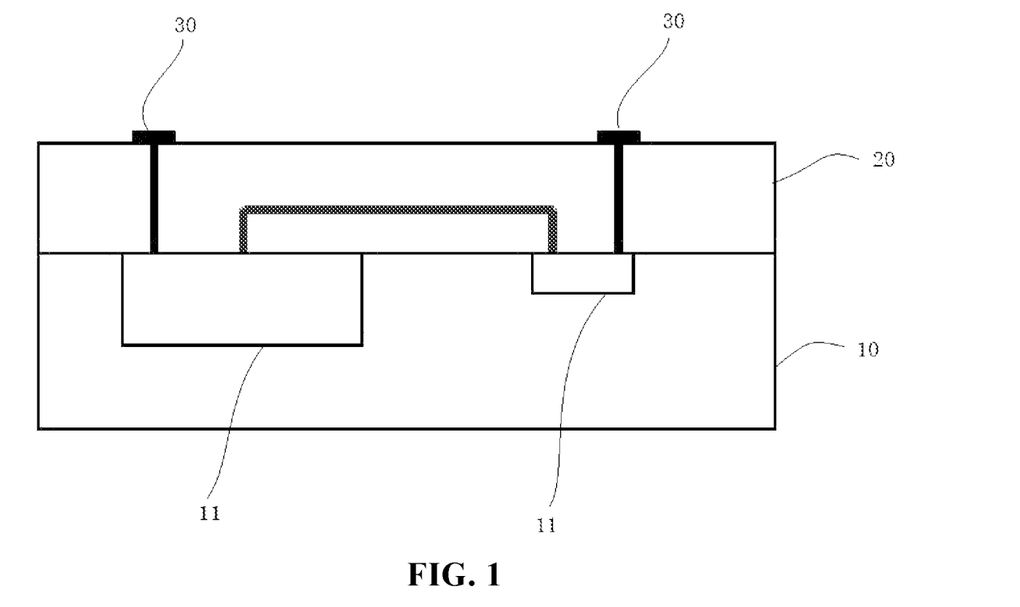
FIG. 1 is a schematic cross-sectional structural diagram of a chip structure according to an embodiment of the present disclosure.
Figure 2:
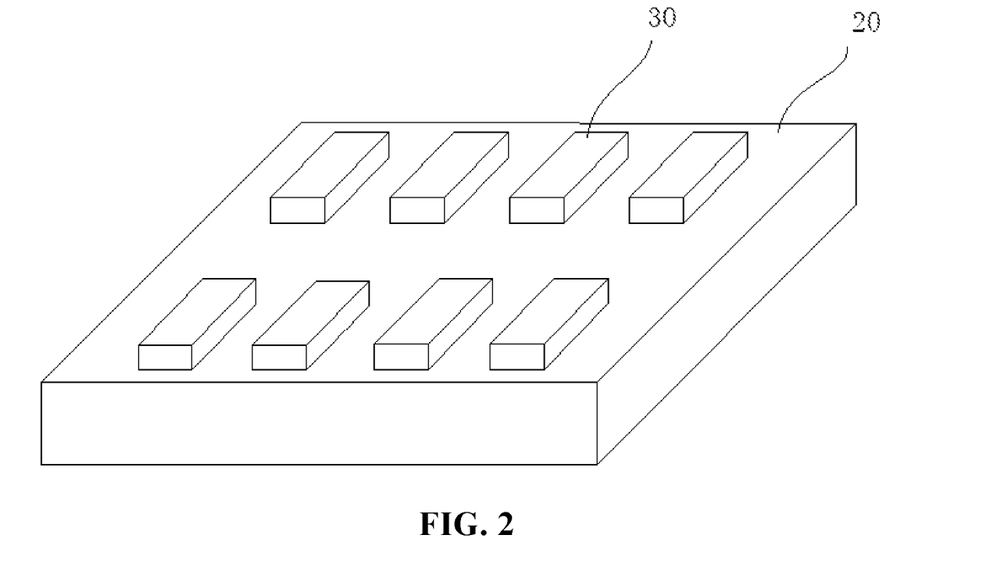
FIG. 2 is a schematic perspective structural diagram of a chip structure according to an embodiment of the present disclosure (a chip body is not shown)
Figure 3:
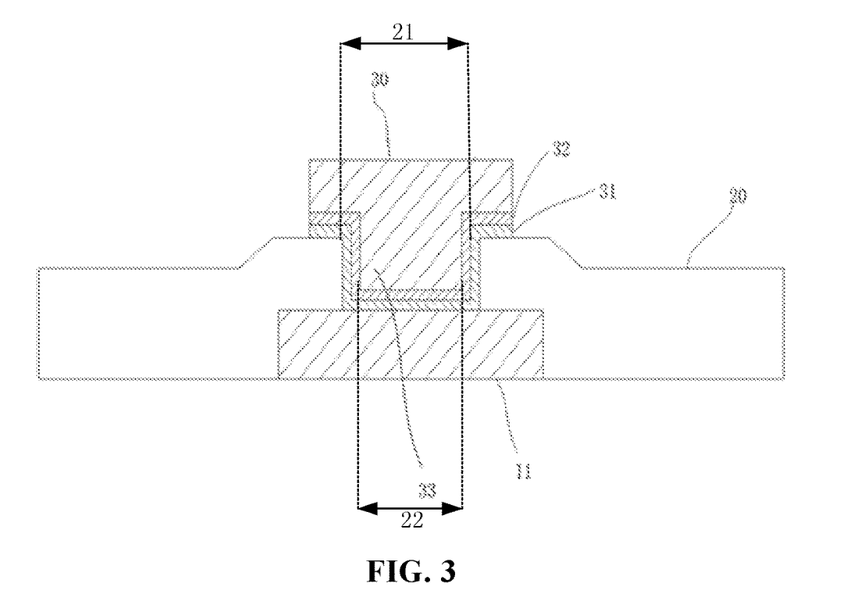
FIG. 3 is a schematic cross-sectional structural diagram of a part of a chip structure according to an embodiment of the present disclosure.

In view of this, the present disclosure provides a chip structure. Referring to FIGS. 1 to 3, FIGS. 1 to 3 are schematic cross-sectional and perspective structural diagrams of a chip structure according to an embodiment of the present disclosure, respectively. As shown in FIG. 1, the chip structure includes at least one chip body 10, which includes at least one radio frequency front-end device 11; the chip structure further includes a redistribution layer 20 stacked on the chip body 10, and at least one pin 30 disposed on the redistribution layer 20; each radio frequency front-end device 11 corresponds to one or more pins 30 in at least one pin; a pin 30 is electrically connected to the corresponding radio frequency front-end device 11 through an electrical connector extending through the redistribution layer 20; an extending direction of the radio frequency front-end device 11 on the redistribution layer 20 is consistent with an extending direction of the pin 30 corresponding to the radio frequency front-end device 11 on the redistribution layer 20; and a surface of the pin 30 distal to the redistribution layer 20 is a first plane.

In the chip structure provided by this embodiment, at least one pin 30 is disposed on the redistribution layer 20; the pin 30 may be electrically connected to the corresponding radio frequency front-end device 11 under the redistribution layer 20 through the electrical connector extending through the redistribution layer 20; the extending direction of the radio frequency front-end device 11 on a surface of the redistribution layer 20 is consistent with the extending direction of the pin 30 corresponding to the radio frequency front-end device 11 on the surface of the redistribution layer 20; and the surface of the pin 30 distal to the redistribution layer 20 is the first plane, which is flat, so that the chip structure may directly electrically connect the chip to the flexible circuit board by providing the pin having the first plane. That is, the chip structure may be connected to the flexible circuit board in a bonding and press-fitting manner by providing the first plane, so that the application scene of the radio frequency front-end chip may be expanded to the flexible substrate, COP (chip on PI/Plastic, the principle thereof is that a part of the screen is directly bent, further reducing the frame, so that the effect of almost no frame may be achieved) is achieved, the integrated narrow frame design is achieved, thereby applying the chip structure with the radio frequency front-end device 11 to the application scene of mobile devices such as mobile phones.

As shown in FIG. 1, a plurality of radio frequency front-end devices 11 may be disposed in a same layer and fixed in a plastic package layer; and a plurality of pins 30 may be disposed to implement electrical connection between each radio frequency front-end device 11 and the flexible circuit board, with the number corresponding to the number of the radio frequency front-end devices 11, so as to implement different functions of different radio frequency front-end devices 11. The two radio frequency front-end devices 11 may also be connected to each other by a metal wire to realize the association between the two radio frequency front-end devices 11.

As shown in FIG. 3, the above electrical connector may be electrically connected to the corresponding radio frequency front-end device 11 through a via 21 extending through the redistribution layer 20. Specifically, the electrical connector extending through the redistribution layer 20 may be simultaneously formed by electroplating during forming a conductive connection body 33 and a pin 30. The redistribution layer 20 may include a plurality of connection lines for electrical connection, and a passivation layer for fixing the plurality of connection lines; and the via 21 may be provided in the passivation layer.

It should be noted that, in this embodiment, specific structures of the radio frequency front-end device 11 and the redistribution layer 20 are not limited, and may have any structure in the art, as long as the pins 30 connected to the radio frequency front-end devices 11 may be formed on the redistribution layer 20. In this embodiment, the specific number of the radio frequency front-end devices 11 included in the chip structure is also not limited, and the chip structure may include only one radio frequency front-end device 11, may include two radio frequency front-end devices 11 as shown in FIG. 1, and may also include more radio frequency front-end devices 11. To enhance the connectivity between the electrical connector and a pin 30 to form a stable pin 30, the electrical connector may be integrally formed with the pin 30, in whole or in part. For example, the electrical connector may include a first conductive connection layer 31, a second conductive connection layer 32, and a conductive connection body 33, which are sequentially disposed in a direction distal to the radio frequency front-end device 11. The conductive connection body 33 is used as a main connecting member for connecting with the pin 30, and may be integrally formed with the pin 30 by using the same material. The first conductive connection layer 31 covers a side wall and a bottom wall of the via 21, and may also cover a portion of an upper surface of the redistribution layer 20, contact the radio frequency front-end device 11 and the redistribution layer 20, and be electrically connected to the radio frequency front-end device 11, so as to prevent the pin 30 from loosening to cause poor contact and the like, thereby enhancing the electrical connection stability and connection strength between the electrical connector and the radio frequency front-end device 11 and the redistribution layer 20. The second conductive connection layer 32 covers the first conductive connection layer 31, and a recess is formed inside the second conductive connection layer 32, and may be regarded as a secondary via 22 of the via 21 described above. The second conductive connection layer 32 is used to connect to the first conductive connection layer 31 and the conductive connection body 33, respectively, so that unstable connection between the conductive connection body 33 and the first conductive connection layer 31 is prevented, the connection strength of the electrical connector may be further improved, and the conductive stability of the pin 30 is further improved.

In order to improve the electrical performance of the pin 30, the pin 30 is usually made of metal. As described above, the conductive connection body 33 may be made of the same material as the pins 30. In order to further enhance the connection strength, the second conductive connection layer 32 may be made of the same material as the conductive connection body 33 and the pin 30. Specifically, the first conductive connection layer 31 and the second conductive connection layer 32 may be formed by a magnetron sputtering process, so that metal particles may bombard a lower film layer during formation, thereby achieving stable and effective connection between the two film layers. The conductive connection body 33 and the pin 30 may be manufactured through an electroplating process to form the conductive connection body 33 and the pin 30 both having a certain thickness. Specifically, the via 21 extending through the redistribution layer 20 may be formed at a position where the redistribution layer 20 covers the electrode layer; the conductive connection body 33 is disposed in the via 21; and the second conductive connection layer 32 and the first conductive connection layer 31 are sequentially disposed between the conductive connection body 33 and the electrode layer, between the conductive connection body 33 and an inner wall of the via, and between the pin 30 and the redistribution layer 20, so that before the conductive connection body 33 and the pin 30 are electroplated, the first conductive connection layer 31 and the second conductive connection layer 32 are formed between the conductive connection body 33 and the pin 30 and between the redistribution layer 20 and the radio frequency front-end device 11, so as to enhance the connection strength between the conductive connection body 33 and the pin 30 and between the redistribution layer 20 and the radio frequency front-end device 11, thereby enhancing the conductive stability of the pin 30 and ensuring good electrical performance thereof.

In an embodiment, the pins 30, the conductive connection body 33, and the second conductive connection layer 32 may be made of metal, such as gold, which has good electrical conductivity and sufficient mechanical strength, so as to ensure the electrical conductivity of the pins 30 and the electrical connector, and ensure the mechanical strength of the pins 30 when the chip structure is bonded (bonding the pins 30) and press-fit, so as to meet the press-fitting requirement.

The first conductive connection layer 31 may include a titanium metal layer and/or a tungsten metal layer, which have good conductivity and strong adhesion with the non-metal and the metal, so that one or more titanium metal layers and/or tungsten metal layers may be disposed between the second conductive connection layer 32 and the radio frequency front-end device 11 and the redistribution layer 20 (i.e., the electrode layer and the passivation layer), which is not specifically limited in this embodiment.

It should be noted that the structure and material of the electrical connector are only one implementation of the present embodiment, which is not specifically limited in this embodiment, as long as it may electrically connect the pin 30 to the radio frequency front-end device 11 reliably.

In order to facilitate connecting the chip structure to the flexible circuit board by using a bonding method, the first plane of a top surface of the pin 30 may be rectangular, and a surface of the radio frequency front-end device 11 proximal to the pin 30 is also rectangular, so as to facilitate matching with a rectangular strip-shaped bonding pressure head, and facilitate the bonding pressure head applying pressure to the pin 30.

Further, a size of the first plane may be designed according to a size of the bonding pressure head. The size of the first plane may be generally designed to be not larger than the size of the bonding pressure head, so that the bonding pressure head may apply pressure to the whole first plane to ensure the press-fitting bonding effect. For example, a width of the bonding pressure head is generally not more than 2 mm, a width of the rectangular first plane may be equal to or less than 2 mm; and a length of the rectangular first plane may be appropriately designed according to a size of the chip body 10. For example, the length may be equal to or less than 50 mm.

Figure 4:
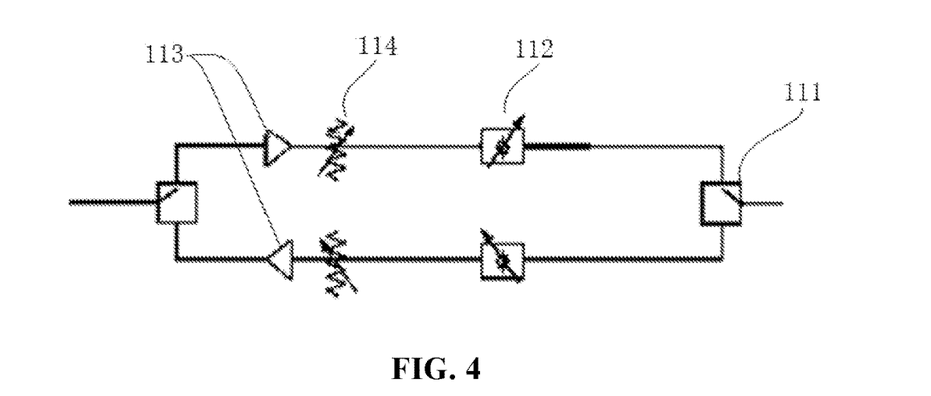
FIG. 4 is a schematic diagram of a single channel of a radio frequency front-end chip according to an embodiment of the present disclosure.

In addition, FIG. 4 is a schematic diagram of a single channel of a radio frequency front-end chip according to an embodiment of the present disclosure. The radio frequency front-end chip (i.e., the chip structure) may include many radio frequency front-end devices and passive devices with different functions, such as switches 111, phase shifters 112, amplifiers 113, attenuators 114, a filter, and a resistor, a capacitor, an inductor, and the like. The radio frequency front-end chip generally includes at least 4 channels. In order to ensure characteristics such as isolation, symmetry, impedance matching, and the like, the radio frequency front-end chip is generally designed in a square sheet shape, and the pins 30 may be provided on each of four sides of a surface of the radio frequency front-end chip.

Figure 5:
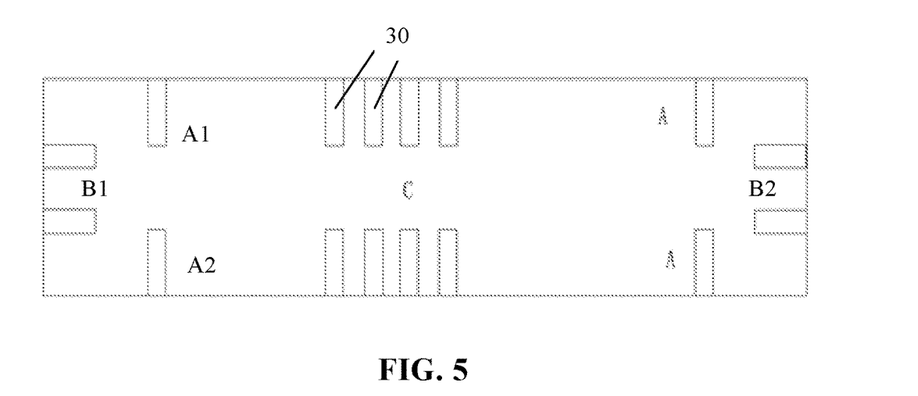
FIG. 5 is a schematic diagram of a layout of pins on a chip structure according to an embodiment of the present disclosure.
Figure 6:
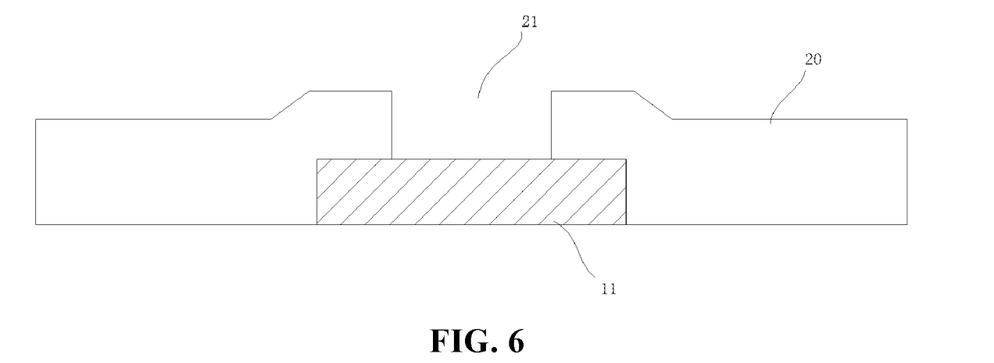
FIGS. 6 to 12 are schematic diagrams illustrating a procedure for manufacturing a pin on a chip structure according to an embodiment of the present disclosure.

As shown in FIG. 5, the chip body 10 may include radio frequency inlet regions A, a radio frequency outlet region B and a power supply region C; and at least one pin 30 may be disposed in the radio frequency inlet regions A, the radio frequency outlet region B and the power supply region C, respectively. For example, a surface of the chip body 10 in contact with the redistribution layer 20 may be rectangular, the radio frequency inlet region A may include a plurality of sub-inlet regions A1 and A2 symmetrically distributed on two opposite sides of the rectangle, and one radio frequency front-end device 11 is disposed at a position corresponding to each sub-inlet region; the radio frequency outlet region B may include a plurality of sub-outlet regions B1 and B2 symmetrically distributed on two opposite sides of the rectangle; and one radio frequency front-end device 11 is disposed at a position corresponding to each sub-outlet region; the power supply region C may include a plurality of sub-power supply regions symmetrically distributed on two opposite sides of the rectangle; and one radio frequency front-end device 11 is disposed at a position corresponding to each sub-power supply region. The plurality of pins 30 may be arranged at intervals in the sub-inlet regions, the sub-outlet regions, and the sub-power supply regions along a length direction or a width direction of the rectangle. Therefore, the radio frequency front-end devices 11 with the same function are symmetrically arranged, and the radio frequency front-end devices 11 with different functions are arranged at intervals in different regions, so that sufficient isolation between the radio frequency front-end devices 11 with different functions may be ensured, and the distribution symmetry, the impedance matching performance and the like of the radio frequency front-end devices 11 are ensured.

Based on a same concept as that of the chip structure, the embodiment further provides a packaging structure, including a flexible circuit board and the chip structure of any of the above embodiments, wherein the flexible circuit board includes an electrical connection pad electrically connected to the pin 30.

The packaging structure provided by the embodiment includes the chip structure and the flexible circuit board packaged together in a bonding manner; the chip structure is provided with at least one pin 30 on the redistribution layer 20; the pin 30 may be electrically connected to a corresponding radio frequency front-end device 11 under the redistribution layer 20 through the electrical connector extending through the redistribution layer 20; the extending direction of the radio frequency front-end device 11 is consistent with the extending direction of the pin 30 corresponding to the radio frequency front-end device 11; the surface of the pin 30 distal to the redistribution layer 20 is the first plane. The chip structure may be connected to the flexible circuit board through the bonding and press-fitting manner by providing the first plane, so that the application scene of the radio frequency front-end chip may be extended onto the flexible substrate, COP (chip on PI/Plastic, the principle thereof is that a part of the screen is directly bent, further reducing the frame, so that the effect of almost no frame may be achieved) is achieved, the integrated narrow frame design is achieved, thereby applying the chip structure with the radio frequency front-end device 11 to the application scene of mobile devices such as mobile phones.

Based on a concept same as that of the chip structure, the embodiment further provides a manufacturing method of the chip structure, which may include steps of:

Providing at least one chip body 10, wherein the chip body 10 includes at least one radio frequency front-end device 11;

Forming a redistribution layer 20 on the chip body 10;

Forming at least one pin 30 on the redistribution layer 20, such that the pin 30 is electrically connected to the corresponding radio frequency front-end device 11 through an electrical connector extending through the redistribution layer 20; each radio frequency front-end device 11 corresponds to the pin 30; an extending direction of the pin 30 is consistent with an extending direction of the radio frequency front-end device 11 corresponding to the pin 30; and a surface of the pin 30 distal to the redistribution layer 20 is a first plane.

As shown in FIGS. 3 and 6 to 10, the step of forming at least one pin 30 on the redistribution layer 20 such that the pin 30 is electrically connected to the corresponding radio frequency front-end device 11 through an electrical connector extending through the redistribution layer 20 may include steps of:

1) Forming a via 21 extending through the redistribution layer 20 at a position where the redistribution layer 20 covers the radio frequency front-end device 11, so that the pin 30 is connected to the radio frequency front-end device 11 through the via 21.

2) Forming a first conductive connection layer 31 of the electrical connector, wherein the first conductive connection layer 31 covers a side wall and a bottom wall of the via 21 and a part of an upper surface of the redistribution layer 20, and is electrically connected to the radio frequency front-end device 11. The first conductive connection layer 31 may be formed using a magnetron sputtering process, and also covers a portion, which is around the via 21 and is in contact with the pin 30, of the upper surface of the redistribution layer 20. The first conductive connection layer 31 may be a titanium metal layer and/or a tungsten metal layer.

3) Forming a second conductive connection layer 32 of the electrical connector on the first conductive connection layer 31, wherein the second conductive connection layer 32 covers the first conductive connection layer 31; and forming a recess inside the second conductive connection layer 32, wherein the recess may be regarded as the secondary via 22 of the via 21 described above. The second conductive connection layer 32 may be formed by a magnetron sputtering process, and may be made of a metal, such as gold.

4) Forming a conductive connection body 33 of the electrical connector in the secondary via 22, so that the conductive connection body 33 is connected to the second conductive connection layer 32. Specifically, the conductive connection body 33 may be formed by an electroplating process to form the conductive connection body 33 with a larger thickness.

5) Then, forming the pin 30 on the conductive connection body 33. Specifically, the pin 30 may cover a region at the edge of the via 21 of the redistribution layer 20 to increase a contact area of the pin 30 with the redistribution layer 20, thereby improving the reliability of the pin 30.

Figure 7:
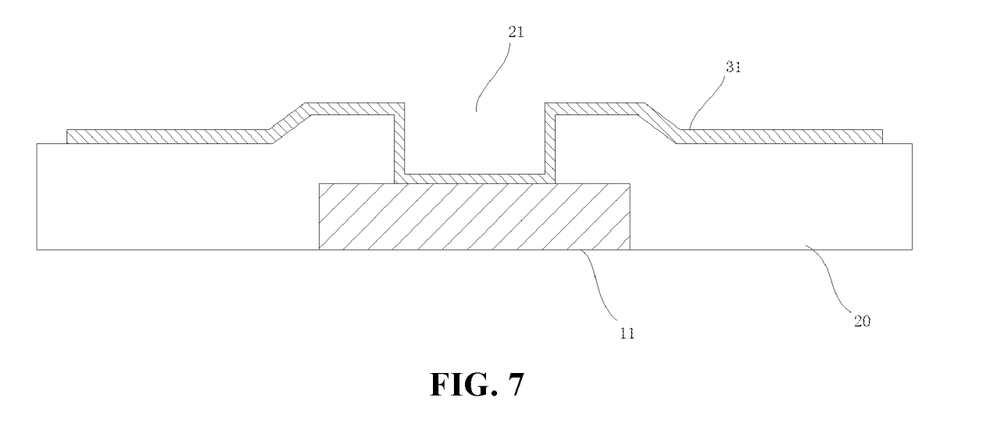
Figure 8:
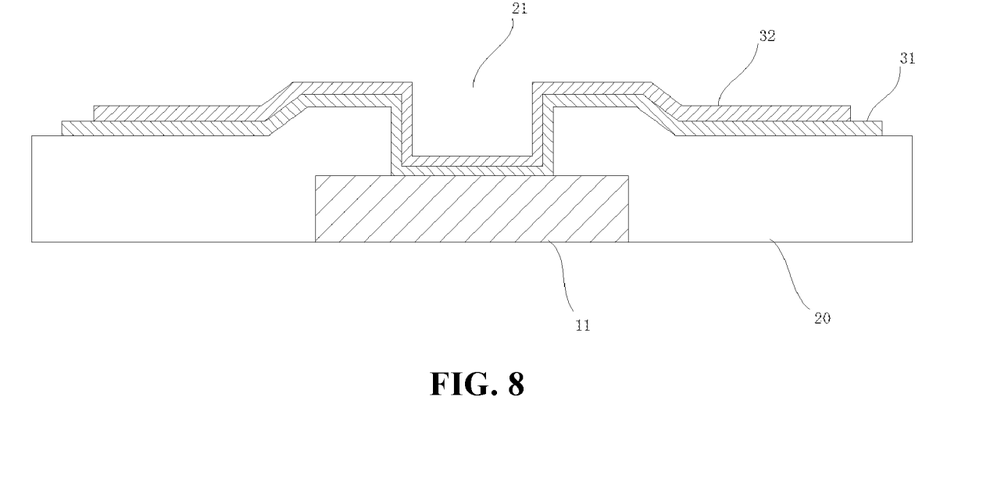
Figure 9:
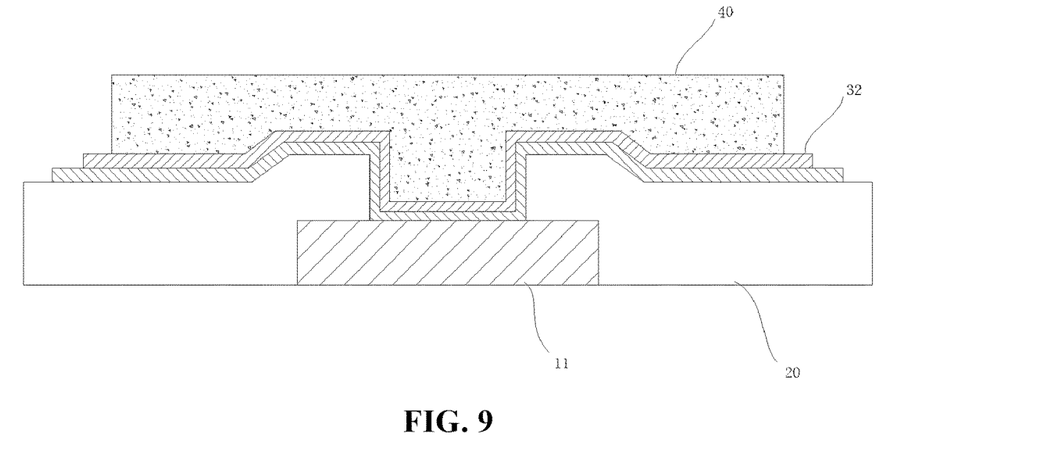
Figure 10:
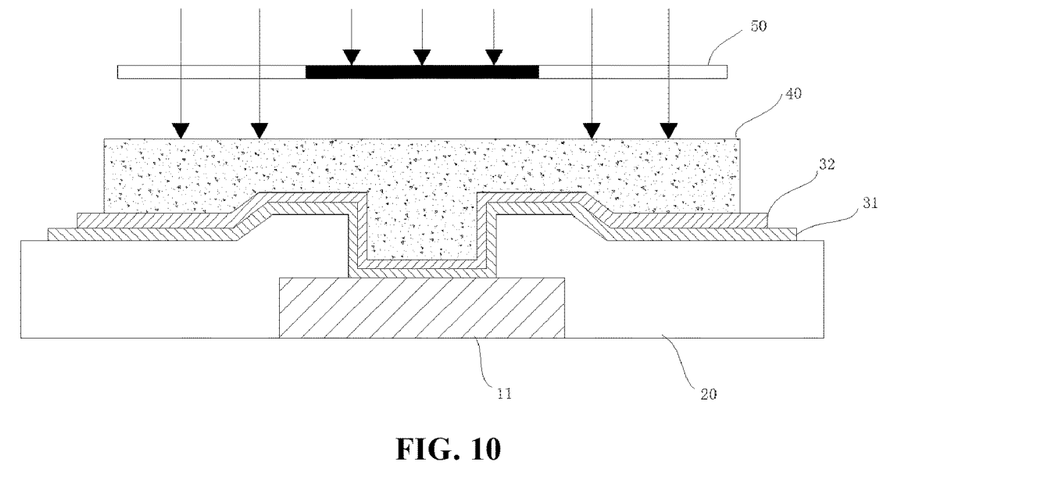
Figure 11:
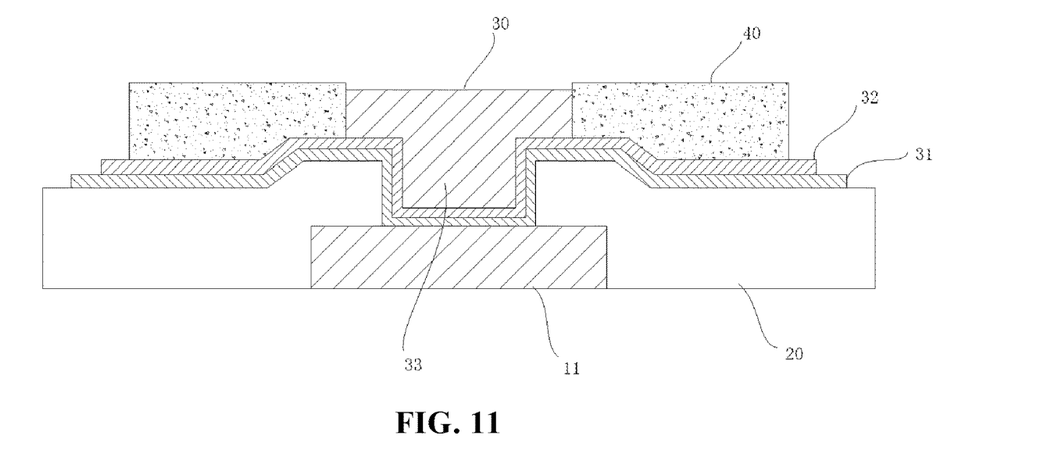
Figure 12:
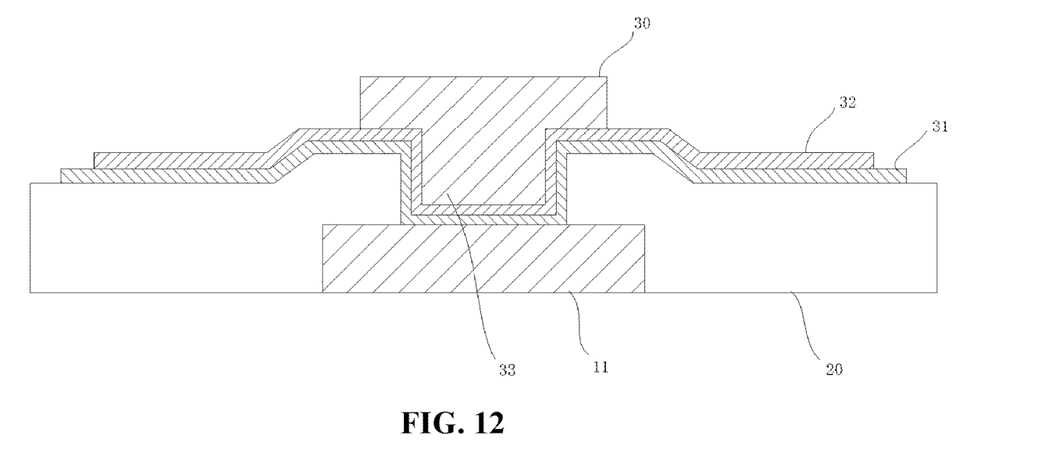

In the process of forming the pin 30, i.e., steps 2) to 5), a BUMP process may be specifically adopted. As shown in FIGS. 7 and 8, a titanium metal layer and/or a tungsten metal layer, and a gold metal layer are sequentially deposited on the redistribution layer 20 in and around the via 21. Then, as shown in FIGS. 9 and 10, a photoresist 40 is coated on the gold metal layer, and is exposed and developed by using a mask to etching away the photoresist 40 in and around the via 21, thereby forming a molding cavity of the pin and exposing the secondary via. Then, as shown in FIG. 11, gold metal is electroplated at a position where the photoresist is etched away, thereby forming the conductive connection body 33 and the pin 30. Finally, as shown in FIG. 12 and FIG. 3, the excess second conductive connection layer 32 and the excess first conductive connection layer 31 except the pin 30 are etched away sequentially to ensure the flatness of the surface of the chip structure.

In the manufacturing method for the chip structure provided by the embodiment the chip structure including the pins 30 may be formed; and the pins 30 are disposed on the redistribution layer 20 of the chip structure, and may be electrically connected to corresponding radio frequency front-end devices 11 under the redistribution layer 20 by the electrical connector extending through the redistribution layer 20; and the extending direction of the radio frequency front-end device 11 is consistent with the extending direction of the pin 30 corresponding to the radio frequency front-end device 11; the surface of the pin 30 distal to the redistribution layer 20 is the first plane. The chip structure may be connected to the flexible circuit board in a bonding and press-fitting manner by providing the first plane, so that the application scene of the radio frequency front-end chip may be expanded to the flexible substrate, COP is achieved, the integrated narrow frame design is achieved, thereby applying the chip structure with the radio frequency front-end device 11 to the application scene of mobile devices such as mobile phones.

Based on the same concept as that of the chip structure, the embodiment further provides a bonding method, which is applied to the packaging structure, and the method includes a step of bonding the pin 30 of the chip structure to the electric connection pad of the flexible circuit board by using a bonding pressure head, so as to electrically connect the electric connection pad with the pin 30, such that a shape of the bonding pressure head matches with a shape of the first plane of the pin 30.

According to the bonding method provided by the embodiment, the chip structure may be connected to the flexible circuit board in a bonding manner, so that the application scene of the radio frequency front-end chip may be expanded to the flexible substrate, COP is achieved, the integrated narrow frame design is achieved, thereby applying the chip structure with the radio frequency front-end device 11 to the application scene of mobile devices such as mobile phones.

It will be understood by a person skilled in the art that steps, measures, technical solutions in various operations, methods, flows discussed in this application may be exchanged, modified, combined, or deleted.

In the description of the present disclosure, it is to be understood that the terms "center", "upper", "lower", "front", "rear", "left", "right", "vertical", "horizontal", "top", "bottom", "inner", "outer", and the like indicate orientations or positional relationships based on those shown in the drawings, merely for convenience of description and simplicity of description, and do not indicate or imply that the indicated devices or elements must have a particular orientation, be constructed and operated in a particular orientation, and thus, are not to be construed as limiting the present disclosure.

The above embodiments are only some embodiments of the present disclosure and it should be noted that it will be apparent to one of ordinary skill in the art that various improvements and modifications may be made without departing from the principle of the present disclosure, and such improvements and modifications also fall within the scope of the present disclosure.

What is claimed is:

1. A chip structure, comprising at least one chip body, each of which comprises at least one radio frequency front-end device, wherein the chip structure further comprises a redistribution layer stacked on the at least one chip body and at least one pin on the redistribution layer; and each of the at least one radio frequency front-end device at least corresponds to one pin of the at least one pin; the pin is electrically connected to the corresponding radio frequency front-end device through a corresponding electrical connector extending through the redistribution layer; an extending direction of the radio frequency front-end device on a surface of the redistribution layer is consistent with an extending direction of the pin corresponding to the radio frequency front-end device on the surface of the redistribution layer, and a surface of the pin distal to the redistribution layer is a first plane; and wherein the chip structure further comprises at least one via corresponding to the at least one pin in the redistribution layer, wherein the electrical connector is arranged in the corresponding via, comprises a first conductive connection layer, a second conductive connection layer and a conductive connection body sequentially arranged along a direction distal to the radio frequency front-end device; and the conductive connection body is configured to be connected to the pin, and the first conductive connection layer covers a side wall and a bottom wall of the via and is electrically connected to the radio frequency front-end device; the second conductive connection layer covers the first conductive connection layer and has a recess in the redistribution layer as a secondary via; and the conductive connection body is in the secondary via, and is electrically connected to the pin.

2. The chip structure according to claim 1, wherein the first plane has a shape of a first rectangle, and a surface of the radio frequency front-end device proximal to the pin has a shape of a second rectangle.

3. The chip structure according to claim 2, wherein a size of the first rectangle and/or the second rectangle is within 2 mm×50 mm.

4. The chip structure according to claim 1, wherein the redistribution layer is a passivation layer.

5. The chip structure according to claim 1, wherein
a portion of the at least one chip body comprises a radio frequency inlet region, a radio frequency outlet region and a power supply region; and
the radio frequency inlet region, the radio frequency outlet region and the power supply region have one or more radio frequency front-end devices, respectively.

6. The chip structure according to claim 5, wherein a surface of the chip body in contact with the redistribution layer is a rectangle; the radio frequency inlet region comprises a plurality of sub-inlet regions symmetrically arranged on two opposite sides of the rectangle, and each of the plurality of sub-inlet region has one radio frequency front-end device; the radio frequency outlet region comprises a plurality of sub-outlet regions symmetrically arranged on two opposite sides of the rectangle, and each of the plurality of sub-outlet regions has one radio frequency front-end device; the power region comprises a plurality of sub-power regions symmetrically arranged on two opposite sides of the rectangle, and each of the plurality of sub-power regions has one radio frequency front-end device.

7. The chip structure according to claim 1, wherein the pin, the conductive connection body and the second conductive connection layer are made of a same material.

8. The chip structure according to claim 7, wherein the pin, the conductive connection body and the second conductive connection layer are all made of gold; and
the first conductive connection layer comprises a titanium metal layer and/or a tungsten metal layer.

9. A packaging structure, comprising a flexible circuit board and the chip structure according to claim 1,
wherein the flexible circuit board comprises at least one electrical connection pad electrically connected to the at least one pin.

10. The packaging structure according to claim 9, wherein the first plane has a shape of a first rectangle, and a surface of the radio frequency front-end device proximal to the pin has a shape of a second rectangle.

11. The packaging structure according to claim 10, wherein a size of the first rectangle and/or the second rectangle is within 2 mm×50 mm.

12. The packaging structure according to claim 9, wherein the redistribution layer is a passivation layer.

13. A manufacturing method for a chip structure, comprising steps of:
providing at least one chip body such that the at least one chip body comprises at least one radio frequency front-end device;
forming a redistribution layer on the at least one chip body;
forming at least one pin on the redistribution layer such that each of the at least one pin is electrically connected to a corresponding radio frequency front-end device through a corresponding electrical connector extending through the redistribution layer, and each of the at least one radio frequency front-end device at least corresponds to one pin of the at least one pin, wherein an extending direction of the pin on a surface of the redistribution layer is consistent with an extending direction of the radio frequency front-end device corresponding to the pin on the surface of the redistribution layer; and a surface of the pin distal to the redistribution layer is a first plane,
wherein the step of forming at least one pin on the redistribution layer such that each of the at least one pin is electrically connected to a corresponding radio frequency front-end device through a corresponding electrical connector extending through the redistribution layer comprises steps of:
forming a via extending through the redistribution layer at a position where the redistribution layer covers the radio frequency front-end device;
forming a first conductive connection layer of the electrical connector such that the first conductive connection layer covers a side wall and a bottom wall of the via and is electrically connected to the radio frequency front-end device;
forming a second conductive connection layer of the electrical connector on the first conductive connection layer such that a recess is formed in the redistribution layer as a secondary via;
coating photoresist on the second conductive connection layer, and performing an exposure process and a development process on the photoresist, to form a molding cavity of the pin and expose the secondary via;
forming a conductive connection body of the electrical connector within the secondary via, and forming the pin within the molding cavity; and
removing a portion of the first conductive connection layer and the second conductive connection layer which are not covered by the pin.

14. The manufacturing method according to claim 13, wherein the step of forming the first conductive connection layer of the electrical connector comprises forming the first conductive connection layer of the electrical connector through a magnetron sputtering process; and
the step of forming the second conductive connection layer of the electrical connector on the first conductive connection layer comprises forming the second conductive connection layer of the electrical connector on the first conductive connection layer through a magnetron sputtering process.

15. The manufacturing method according to claim 14, wherein
the step of forming the conductive connection body of the electrical connector within the secondary via and forming the pin within the molding cavity comprises forming the conductive connection body of the electrical connector within the secondary via and forming the pin within the molding cavity through an electroplating process.

16. The manufacturing method according to claim 15, wherein
the first conductive connection layer comprises a titanium metal layer and/or a tungsten metal layer; and
a material of the second conductive connection layer comprises gold.

17. The manufacturing method according to claim 16, wherein a material of the pin and the conductive connection body comprises gold.

\* \* \* \* \*